July 7, 1970 H. VOIGT 3,519,892

SUPERCONDUCTING GENERATOR

Filed Sept. 26, 1968

3,519,892

SUPERCONDUCTING GENERATOR

Hans Voigt, Erlangen, Germany, assignor to Siemens Aktiengesellschaft, Berlin and Munich, Germany, a corporation of Germany Filed Sept. 26, 1968, Ser. No. 762,947
Claims priority, application Germany, Sept. 29, 1967, S 112,123
Int. Cl. H01h *47/60*
U.S. Cl. 317—123 4 Claims

ABSTRACT OF THE DISCLOSURE

A superconducting generator has a sheet-like superconductor across which an electrically normal-conducting spot is moved. The spot is traversed by a magnetic flux which is adjusted to reduce the magnitude of the current flowing in the region of the superconductor lying ahead of the spot in its path of motion.

My invention relates to superconducting generators for producing a current in an electric circuit.

In superconducting generators, or flux pumps as they are sometimes called, an electric current is produced in an electric circuit, especially in a superconducting circuit, by passing an electrically normal conducting spot traversed by magnetic flux across a sheet-like constructed superconductor forming part of the electric circuit. The sheet-like superconductor may have the shape of a planar surface or a cylinder housing and may be formed of sheet metal, of thin superconducting layers or of a number of wires or bands connected in parallel and disposed in a single plane.

The normal-conducting spot is generally produced by a spatially restricted magnetic field which is positioned substantially perpendicularly to the sheet-like superconductor and which is larger than the critical magnetic field of the sheet-like superconductor. This magnetic field causes a limited region or spot of the sheet-like superconductor to become normal-conducting thereby permitting a magnetic flux to penetrate the spot. The other portions of the sheet-like superconductor remain superconducting so that a current flowing therein does not encounter any ohmic resistance or resistivity. The normal-conducting spot is moved across the sheet-like superconductor in the known superconducting generators, for example, by means of a moving permanent magnet or electromagnet, or by means of a revolving magnetic rotary field. The magnetic flux which is moved across the sheet-like superconductor induces an electrical current in a connected electric circuit. The construction principles and the method of operation of such superconducting generators are described in more detail in the periodical "IEEE Spectrum," vol. 1, 1964, No. 12, pages 67 to 71. The sheet-like superconductors of the superconducting generators are cooled to a temperature of several degrees Kelvin to achieve the superconducting state and are particularly well suited to supply current for superconducting magnetic coils.

It was found that in the known superconducting generators, wherein the magnetic flux which traverses the normal-conducting spot is kept at a constant value, losses occur because, during the movement of the normal-conducting spot across the superconductor, the region of the superconductor lying ahead of the normal-conducting spot in the path of motion is transferred from the superconducting state into the normal-conducting state while the current flowing in this region still has its full strength. This current is squelched by the ohmic resistance of the moving normal-conducting spot, specifically, by a dissipative process and therefore does not reappear completely in the superconducting portion of the sheet-like superconductor. A Joule heat loss occurs when the current is squelched by the ohmic resistance of the normal-conducting spot which is moved through the superconductor. This increases consumption of the coolant, and specifically, it increases evaporation of the liquid helium which is customarily used for cooling the superconductor.

It is an object of my invention to devise a superconducting generator wherein the above losses are substantially reduced.

It is another object of my invention to provide a superconducting generator wherein the above losses are reduced by providing the generator with a sheet-like superconductor and with means for moving an electrically normal-conducting spot traversed by magnetic flux across the latter.

It is still another object of my invention to provide a superconducting generator wherein the magnetic flux traversing the electrically normal-conducting spot is adjusted in dependence upon the current distribution in superconductor of the generator.

In accordance with a feature of my invention the magnetic flux is varied during the movement of the normal-conducting spot across the superconductor so that the current flowing in the region of the latter lying ahead of the normal-conducting spot in the path of motion is reduced in magnitude before this region transfers from the superconducting into an electrically normal-conducting state. Adjusting the magnetic flux traversing the normal-conducting spot, induces a current in the sheet-like superconductor which opposes the current already present in the region of the superconductor lying ahead of the normal-conducting spot. Consequently, during the transition of this region from the superconducting into the electrically normal-conducting state, a smaller current must be squelched by the ohmic resistance or resistivity of the normal-conducting spot. The losses which occur during the operation of the generator of the present invention are therefore reduced as compared to those of the known generators. The current which flows in the region of the superconductor which lies behind the normal-conducting spot is increased by the current induced by the change of flux.

It is preferable to construct the generator of the present invention so that the magnetic flux is adjustable to reduce the current density to substantially zero in the region of the superconductor lying directly ahead of the normal-conducting spot, the region being the next to be transferred from the superconducting into the normal-conducting state. The reduction in current density is effected prior to the transition of this region into the normal-conducting state. Therefore, the current flowing in the region of the superconductor lying directly ahead of the normal-conducting spot is virtually nullified by the current which is induced by the change in the magnetic flux, so that in this region, there is only an insignificant flow of current when the region transfers from the superconducting to the normal-conducting state with the advance of the normal-conducting spot. A squelch of the current by an ohmic resistance and the associated losses are virtually eliminated in this embodiment of the generator.

The current distribution in the sheet-like superconductor, and thereby the change in the magnetic flux which is required to reduce the current flowing in the region of the superconductor lying ahead of the normal conducting spot, may be calculated in simple cases without much difficulty. However, since the current distribution depends on the material and the geometric shape of the sheet-like superconductor, and also, on the operating conditions of the superconducting generator, it is preferable to measure the current distribution by means of magnetic field probes, such as Rogowski coils, galvano-magnetic semiconductors resistors or Hall generators. The measured values of distributed current are utilized to control the magnetic flux in the normal-conducting spot. In an especially preferred embodiment of a generator according to the invention, an electromagnet is provided to produce a magnetic flux having a magnetic field controllable in dependence upon the current distribution in the sheet-like superconductor measured by magnetic field probes. Or, a magnet may be provided which produces a constant magnetic flux and which is coordinated with one or more additional magnets for changing the magnetic flux. Once the operational conditions are established by measurements for a specific type of superconducting generator, the change of the magnetic flux in the normal-conducting spot can also be controlled by a program.

Other features which are considered as characteristic for the invention are set forth in the appended claims.

Although the invention is illustrated and described herein as embodied in Supeconducting Generator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description on specific embodiments when read in connection with the accompanying drawings, in which.

Figure 1:
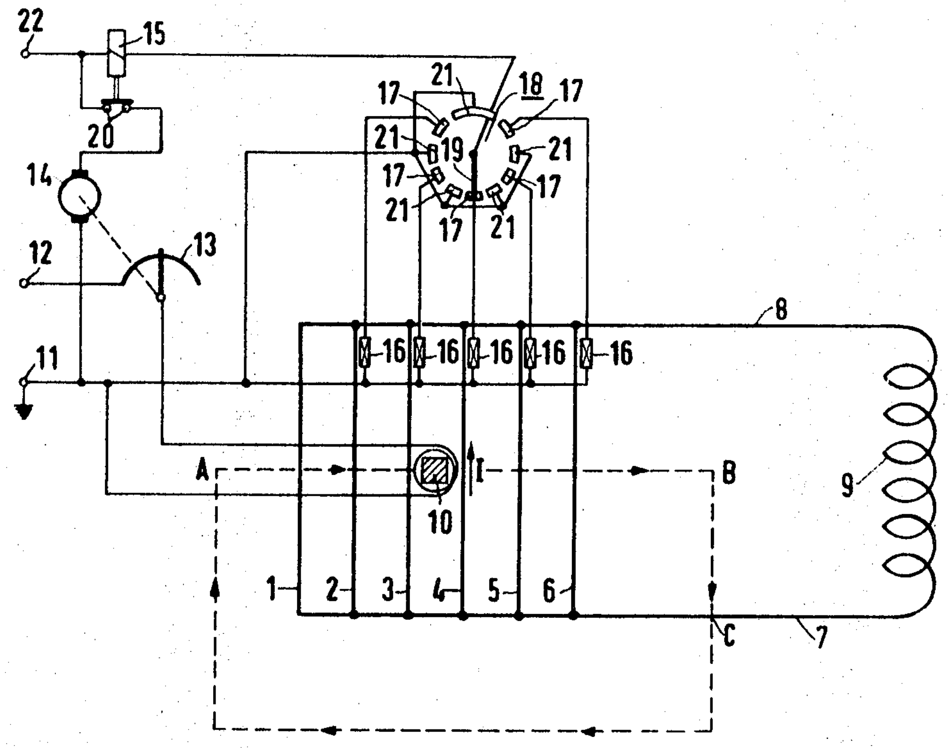
FIG. 1 is an electric schematic diagram of a superconducting generator having a sheet-like constructed superconductor comprised of a plurality of super-conducting wires connected in parallel.

The superconducting generator shown in FIG. 1 offers especially simple operating conditions. The sheet-like constructed superconductor of this generator comprises several conductors 1 to 6 which are connected in parallel across conductors 7 and 8. By way of example, a superconducting coil 9 for which the generator supplies current is similarly connected across the conductors 7 and 8. All superconductive parts are arranged in a cryostat not illustrated in FIG. 1. Within the cryostat, the superconductive parts are cooled to a temperature below their critical temperature by being immersed in liquid helium.

In order to establish the normal conducting spot in the sheet-like constructed superconductor, an electromagnet is provided which is directed near to and along one side of the superconductor and which has a pole face 10 as shown in FIG. 1. The superconducting conductors 1 to 6 consist of a superconductive material having a critical magnetic field smaller than the magnetic field developed by the magnet 10 so that these conductors will transfer from the superconducting state to the normal conducting state when entering this magnet field. The wires 1 to 6 can be made, for example, of lead. In contrast, the superconducting wires 7 and 8 consist of a superconductive material such as, for example, a niobium-zirconium alloy and have a critical magnetic field higher than the magnetic field developed by the magnet 10 so that these wires will always remain superconducting when the generator is in use. When the generator is operating, the magnet 10 is moved from A to B while at the same time establishing a normal-conducting spot in the sheet-like constructed superconductor. This spot moves with the magnet 10 and has a magnetic flux $\phi$. Finally, the magnet 10 is again returned to the starting point A without parts of the superconducting circuit becoming normal-conducting. The magnet 10 can, for example, be directed from the superconducting circuit at point C by passing over superconducting wire 7, the latter having a sufficiently high critical magnetic field. This action causes an electric current to be induced in the superconducting circuit comprising the sheet-like superconductor, the superconducting wires 7 and 8 and the superconducting coil 9. For the case in which the magntic field is directed into the plane of the drawing, the induced current flows in the sheet-like conductor in the direction of the arrow I. The current in the superconducting circuit is increased by repeating the described movement of the magnet 10.

In FIG. 1, the position of magnet 10 is such that superconducting wire 4 is the next wire to be made normal-conducting by the movement of the magnet 10. The current I flowing in wire 4 encounters an ohmic resistance when the segment of wire 4 crossed by the passing magnet 10 transfers into the normal-conducting state. This corresponds to the previously mentioned losses. To minimize these losses, the magnetic flux developed by the magnet 10 is so modified before the magnet 10 reaches the wire 4 that the current I in wire 4 induced by the flux change is reduced practically to zero. The required change in flux is given by $$\Delta\phi = -L \cdot I$$

where L is the inductance of the circuit loop enclosed by the magnetic flux developed by the magnet 10, the circuit loop consisting of the superconducting wires 3 and 4 and the parts of the superconductors 7 and 8 which connect these wires 3 and 4. The current in wire 4 is then practically non-existent when transferring from the superconducting state to the normal-conducting state. Simultaneously, an additional current is induced by this flux change in the superconducting wire 3 now behind the normal-conducting spot.

After the magnet 10 has passed away from wire 4 which now again is in the superconducting state, the current flowing in wire 5 is reduced to almost zero by a new change in flux before this wire 5 is transferred into the normal-conducting state. The other wires of the sheet-like superconductor are acted upon in the same manner. However, with the movement of the magnet 10 across the sheet-like superconductor, the first change in magnetic flux should occur for each rotation of the magnet 10 when the magnetic flux is completely surrounded by superconductors, specifically, when the magnet 10 is located between the superconducting wires 1 and 2. After passing point C, the magnetic flux is again brought appropriately to its original value by means of the magnet 10 while on the way to point A.

In order to change the magnetic flux, the magnetic field of the magnet 10 is controlled in dependence upon the current flowing in that conductor of the superconducting wires 2 to 6 which is the next to be made normal-conducting. In the embodiment shown in FIG. 1, the magnetic field of magnet 10 is provided with current from terminals 11 and 12. A change in the magnetic field is achieved with a potentiometer 13 connected to current lead-in wires, the potentiometer 13 being adjusted by means of a servomotor 14. The servomotor is switched on and off by relay 15 whose position in each case is controlled by the current flowing in that superconducting wire which is next to be made normal-conducting. For this purpose, a magnetic field responsive semiconductor resistor 16 is placed next to each of the wires 2 to 6. Each of these semiconductor resistances is connected to a contact 7F of the rotary switch 18. The switching member 19 of the rotary switch 18 is rotated in synchronism with the movement of magnet 10 so that when the magnet 10 is at a position between two of the superconducting wires 2 to 6, the semiconductor resistance 16 corresponding to the wire which is next to be made normal-conducting is connected through relay 15 to a voltage source applied between terminals 11 and 22. In FIG. 1, the semiconductor resistance 16 corresponding to wire 4 is thus connected. When a current flows through this wire, its magnetic field causes the resistance of the semiconductor resistance to increase. Under this condition, only a small current flows through the magnetic field dependent semiconductor resistance to which the suitably positioned relay 15 does not respond. For this switching position of the relay 15, the servomotor 14 is connected to the voltage applied across the terminals 11 and 22 and positions the potentiometer 13 so that the current in the winding of the magnet 10 is reduced. The magnetic flux of magnet 10 is correspondingly reduced whereby a current is induced in the conductor loop enclosing this flux. This induced current is directed in opposition to the current already flowing in superconducting wire 4. The magnitude of the current in wire 4 is thereby reduced. When the current in wire 4 is reduced, the current in the corresponding semiconductor resistance 16 increases until the relay 15 actuates, whereupon the connection formed by the contact 20 is broken and the servomotor 14 disconnected. The relay 15 and the semiconductor resistances 16 are accordingly so correlated with each other that the relay 15 first actuates when the current in wire 4 has reached a minimum value, specifically when it is reduced to practically zero. The potentiometer 13 must be positioned by the servomotor 14 so rapidly that the required change of magnetic flux can take place in the time that the magnet 10 is between the wires 3 and 4. The magnet 10 is subsequently moved past the wire 4 in which the current is practically zero, whereby the wire 4 becomes normal-conducting. During this movement, the switching member 19 of the rotary switch 18 traverses one of the contacts 21. The relay 15 thereby remains open so that the connection between the contacts 20 is interrupted, the servomotor 14 is disconnected and the magnetic flux during the movement of the magnet 10 will not be changed. As soon as the magnet 10 is between the superconducting wires 4 and 5, the rotary switch 18 connects the semiconductor resistance 16 corresponding to wire 5 to relay 15 via the next contact 17 whereby a new change of the magnetic field of the magnet 10 can occur. Also, if the magnet 10 is moved back to A, past points B and C, the relay will remain open. The potentiometer 13 is again re-a higher critical magnetic field and are wires or bands turned to the starting position by a mechanical means as the magnet 10 traverses the path from C to A. In lieu of the arrangement shown in FIG. 1, an electronic means, for example, can be applied to control the changes of the magnetic flux.

Figure 2:
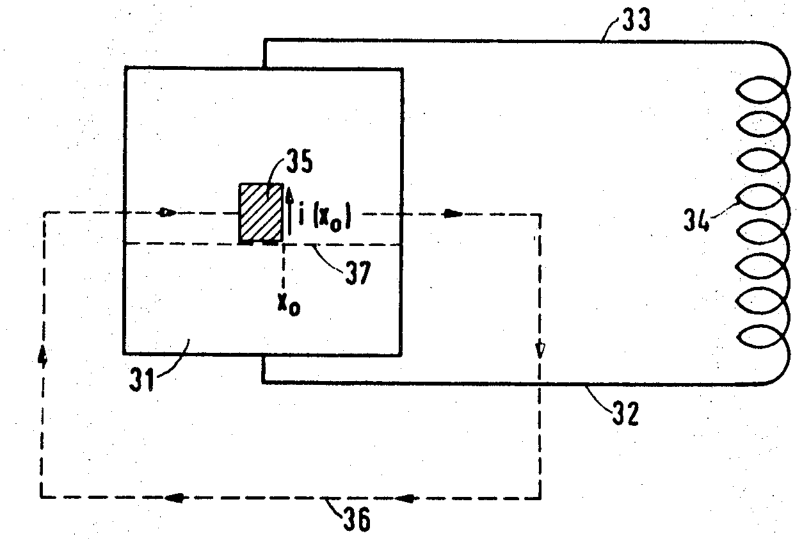
FIG. 2 is an electric schematic diagram of a superconducting generator having a sheet-like constructed superconductor comprised of a superconducting plate.

In the superconducting generator illustrated in FIG. 2 a superconducting plate 31 is provided as the sheet-like superconductor. The plate may consist of lead or niobium, for example. The superconductors 32 and 33 which connect the plate 31 with the superconducting coil 34 have made of niobium-zirconium. A pole of an electromagnet which is moved along close to the surface of the plate 31 produces a normal-conducting spot 35 in the plate 31. The spot is traversed by a magnetic flux and is moved across the plate 31. If the electromagnet is directed along a path 36 as shown in FIG. 2, an electric current is produced in the superconducting circuit comprised of plate 31, the superconductors 32 and 33, and the coil 34. During the movement of the normal-conducting spot 35 across the plate 31, the regions of the plate 31 lying immediately ahead of the spot in the direction of motion transfer in a continuous sequence from the superconducting into the electrically normal-conducting state. To avoid ohmic losses during this transition, the flux traversing the normal-conducting spot 35 is changed during the movement of the normal-conducting spot so that the current density already present in the region of the plate lying directly ahead of the normal-conducting spot is greatly reduced, the reduction in current density occurring before this region transfers into the electrically normal-conducting state.

If a current density $i(x_0)$ is present at the front edge of the normal-conducting spot, approximately at point $x_0$ in FIG. 2, or in its closest vicinity, the magnetic flux in the normal conducting spot 35 is changed so that a current density is induced at position $x_0$ which is about equal in magnitude to the already present current density $i(x_0)$ and which is directed in opposition thereto. In this way the current density at position $x_0$ is virtually zero when the transition from the superconducting to the electrically normal-conducting state occurs. In the superconducting region of plate 31 lying behind the normal-conducting spot 35, the change in flux causes the current to increase by the same magnitude. The current density at position $x_0$, in particular, in its immediate vicinity, the extent of which is determined with attainable measuring precision, may be measured by appropriate magnetic field measuring probes, for example, by Hall generators. At position $x_0$, the magnetic field intensity which is produced by the current which flows in the region of plate 31 lying ahead of the normal-conducting spot 35 and the magnitude of the gradient of the magnetic field in the direction of motion of the spot 35 depends upon whether the current density has still a substantial value at position $x_0$ or whether it is already substantially zero, specifically, whether it has been reduced below a very small value. Therefore, by measuring the magnetic field intensity, in particular, its gradient or both magnitudes, the current density may be established at position $x_0$. With these measured values, the current supply of the electromagnet, and consequently, the change of the magnetic flux may be continuously controlled to reduce the current density. To measure the magnitude of the magnetic field, one or several magnetic field measuring probes may be directed along the plate 31 immediately ahead of the normal-conducting spot 35 close to the surface of plate 31. Or, several measuring probes may be attached along the dotted line 37 on the plate 31. In this embodiment of the superconducting generator, the change in magnetic flux should first occur at the time when the normal-conducting spot 35 is completely enclosed by the superconducting regions of plate 31.

During the operation of the superconducting generator, care must be taken to ensure that the magnetic field which produces the normal-conducting spot 35 is selected large enough so that, because of the flux changes of the magnetic field effected during the movement of the normal-conducting region 35 across the plate 31, the magnetic field is not reduced to the point where it becomes smaller than the critical magnetic field of the superconducting plate 31.

I claim:

1. A superconducting generator comprising sheet-like superconducting circuit means for receiving magnetic energy, means for moving an electrically normal conducting spot along a given path across said circuit means, said spot being traversible by magnetic flux, and adjustment means for adjusting the intensity of said flux as said spot is moved across said circuit means so that the magnitude of a current in a region of said circuit means lying in said path ahead of said spot is reduced before said region transfers from superconducting state to electrically normal conducting state.

2. A superconducting generator according to claim 1, wherein said adjustment means is adapted to adjust the intensity of said magnetic flux so that the current intensity in a region of said circuit means next transferable from superconducting state to electrically normal conducting state is reduced to substantially zero before transfer occurs, said region lying in said path adjacent said spot in the forward direction.

3. A superconducting generator according to claim 1, wherein said generator further comprises magnetic circuit means for producing said magnetic flux, and at least one magnetic field-dependent device disposed in operative proximity to said circuit means for measuring current distribution in the latter, said adjustment means being coupled to said magnetic circuit means and connected to said magnetic field-dependent device for adjusting said magnetic flux in dependence upon the current distribution in said circuit means.

4. A superconducting generator according to claim 3, wherein said magnetic circuit means is an electromagnet.

References Cited

UNITED STATES PATENTS

| | | | |
|---|---|---|---|
| 3,336,489 | 8/1967 | Volger | 335—216 XR |
| 3,336,509 | 8/1967 | Atherton | 317—123 |

GEORGE HARRIS, Primary Examiner

U.S. Cl. X.R.

324—45; 335—216